US011592497B2

(12) United States Patent
Hock

(10) Patent No.: US 11,592,497 B2
(45) Date of Patent: Feb. 28, 2023

(54) SYSTEM AND METHOD FOR MONITORING ONE OR MORE CHARACTERISTICS OF AN ULTRACAPACITOR

(71) Applicant: AVX Corporation, Fountain Inn, SC (US)

(72) Inventor: Joseph M. Hock, Surfside Beach, SC (US)

(73) Assignee: KYOCERA AVX COMPONENTS CORPORATION, Fountain Inn, SC (US)

(*) Notice: Subject to any disclaimer, the term of this patent is extended or adjusted under 35 U.S.C. 154(b) by 21 days.

(21) Appl. No.: 17/330,596

(22) Filed: May 26, 2021

(65) Prior Publication Data
US 2021/0373088 A1 Dec. 2, 2021

Related U.S. Application Data

(60) Provisional application No. 63/033,390, filed on Jun. 2, 2020.

(51) Int. Cl.
G01R 31/54 (2020.01)
G01R 31/64 (2020.01)
(Continued)

(52) U.S. Cl.
CPC ............. *G01R 31/64* (2020.01); *H01G 2/14* (2013.01); *H02J 7/345* (2013.01)

(58) Field of Classification Search
CPC .. H02J 2207/50; H02J 7/04; H02J 1/06; H02J 7/0021; H02J 2207/20; H02J 1/14;
(Continued)

(56) References Cited

U.S. PATENT DOCUMENTS 6,480,368 B1 11/2002 Lammers et al.
6,806,686 B1 10/2004 Thrap
(Continued)

FOREIGN PATENT DOCUMENTS

JP 5304654 10/2013
JP 6668102 3/2020
(Continued)

OTHER PUBLICATIONS

BQ3 3100 Super Capacitor Manager, Texas Instruments, Jan. 2011, Revised Dec. 2019, 67 pages.
(Continued)

*Primary Examiner* — Vinh P Nguyen
(74) *Attorney, Agent, or Firm* — Dority & Manning, P.A.

(57) ABSTRACT

A method for monitoring one or more characteristics of an ultracapacitor is provided. The method includes obtaining a plurality of voltage measurements. Each of the voltage measurements can be obtained sequentially at one of a plurality of intervals. Furthermore, each of the voltage measurements can be indicative of a voltage across the ultracapacitor. The method can include determining an actual voltage step of the ultracapacitor based on two consecutive voltage measurements of the plurality of voltage measurements. The method can further include determining whether the actual voltage step exceeds a threshold voltage step of the ultracapacitor. Furthermore, in response to determining the actual voltage step exceeds the threshold voltage, the method can include providing a notification associated with performing a maintenance action on the ultracapacitor.

20 Claims, 4 Drawing Sheets

(51) Int. Cl.
*H01G 2/14* (2006.01)
*H02J 7/34* (2006.01)

(58) Field of Classification Search
CPC ........... H02J 7/345; H01G 2/10; H01G 2/106; H01G 9/15; H01G 11/68; H01G 11/32; H01G 11/78; H01G 11/14; H01G 11/84; H01G 11/10; H01G 11/04; H01G 11/70; H01G 4/30; H01G 11/08; H01G 11/16; H01G 2/14; G01R 31/64; G01R 31/3835; G01R 31/36; G01R 31/396; G01R 31/382; G01R 31/371; G01R 31/392
See application file for complete search history.

(56) References Cited

U.S. PATENT DOCUMENTS

| | | | |
|---|---|---|---|
| 7,342,768 B2 | 3/2008 | Doljack et al. | |
| 7,345,454 B2 | 3/2008 | Thrap | |
| 7,457,100 B2 | 11/2008 | Nakajima et al. | |
| 7,482,816 B2 | 1/2009 | Odajima et al. | |
| 7,531,987 B2 | 5/2009 | Ohasi et al. | |
| 7,599,167 B2 | 10/2009 | Doljack | |
| 7,599,168 B2 | 10/2009 | Doljack et al. | |
| 7,647,191 B2 | 1/2010 | Kakiuchi et al. | |
| 7,660,084 B2 | 2/2010 | Kim et al. | |
| 7,880,449 B2 | 2/2011 | Thrap | |
| 8,049,470 B2* | 11/2011 | Khan | H01G 11/10 320/167 |
| 8,134,337 B2 | 3/2012 | Morita | |
| 8,198,870 B2 | 6/2012 | Zuercher | |
| 8,305,035 B2 | 11/2012 | Morita et al. | |
| 8,400,026 B2* | 3/2013 | Park | H02J 7/345 307/109 |
| 8,463,562 B2 | 6/2013 | Nakanishi | |
| 8,686,662 B1 | 4/2014 | Bragg et al. | |
| 9,018,922 B2 | 4/2015 | Morita et al. | |
| 9,190,860 B2 | 11/2015 | Wright et al. | |
| 9,209,653 B2 | 12/2015 | Maynard et al. | |
| 9,331,500 B2* | 5/2016 | Knitt | H02J 7/0016 |
| 10,461,559 B2* | 10/2019 | Armstrong | H02J 7/0077 |
| 10,826,306 B2* | 11/2020 | Wagoner | H02J 7/0013 |
| 10,879,720 B2 | 12/2020 | Hock | |
| 10,903,663 B2* | 1/2021 | Hock | H02J 7/0016 |
| 11,122,133 B2* | 9/2021 | Kumnick | H04L 67/53 |
| 2009/0231764 A1 | 9/2009 | Banting et al. | |
| 2013/0278227 A1 | 10/2013 | Knitt et al. | |
| 2014/0114592 A1 | 4/2014 | Eilertsen | |
| 2016/0243960 A1 | 8/2016 | Wood et al. | |
| 2016/0298590 A1 | 10/2016 | Garrard et al. | |
| 2016/0301221 A1 | 10/2016 | Kaminsky | |
| 2020/0091739 A1 | 3/2020 | Wagoner et al. | |
| 2021/0408807 A1* | 12/2021 | Hock | H02J 7/0019 |

FOREIGN PATENT DOCUMENTS

| | | |
|---|---|---|
| JP | 6668102 B2 * | 3/2020 |
| KR | 100733394 | 6/2007 |
| KR | 100998661 | 12/2010 |
| WO | WO2009118119 | 10/2009 |
| WO | WO2009118120 | 10/2009 |

OTHER PUBLICATIONS

International Search Report and Written Opinion for PCT/US2021/034188 dated Sep. 15, 2021, 7 pages.

* cited by examiner

SYSTEM AND METHOD FOR MONITORING ONE OR MORE CHARACTERISTICS OF AN ULTRACAPACITOR

PRIORITY CLAIM

This application claims the benefit of priority of U.S. Provisional Patent Application Ser. No. 63/033,390, filed on Jun. 2, 2020, titled "System and Method for Monitoring One or More Characteristics of an Ultracapacitor," which is incorporated herein by reference.

BACKGROUND

Electrical energy storage cells are widely used to provide power to electronic, electromechanical, electrochemical, and other useful devices. A double layer ultracapacitor, for instance, can employ a pair of polarizable electrodes that contain carbon particles (e.g., activated carbon) impregnated with a liquid electrolyte. Due to the effective surface area of the particles and the small spacing between the electrodes, large capacitance values can be achieved. The individual double layer capacitors may be combined together to form a module having a raised output voltage or increased energy capacity.

SUMMARY

One aspect of the present disclosure is directed to a method for monitoring one or more characteristics of an ultracapacitor. The method includes obtaining, via a control circuit, a plurality of voltage measurements. Each voltage measurement of the plurality of voltage measurements can be obtained sequentially at one of a plurality of intervals. In addition, each of the plurality of voltage measurements can be indicative of a voltage across the ultracapacitor. The method can include determining, via the control circuit, an actual voltage step of the ultracapacitor based on two consecutive voltage measurements of the plurality of voltage measurements. The method can further include determining, via the control circuit, whether the actual voltage step exceeds a threshold voltage step of the ultracapacitor. Furthermore, in response to determining the actual voltage step exceeds the threshold voltage step, the method can include providing, via the control circuit, a notification associated with performing a maintenance action on the ultracapacitor.

Another aspect of the present disclosure is directed to a system for monitoring one or more characteristics of an ultracapacitor. The system includes one or more switching devices configured to selectively couple the ultracapacitor to a power source or a load. The system further includes a control circuit communicatively coupled to the one or more switching devices. The control circuit is configured to obtain a plurality of voltage measurements. Each of the plurality of voltage measurements can be obtained sequentially at one of a plurality of intervals. Furthermore, each of the plurality of voltage measurements can be indicative of a voltage across the ultracapacitor. The control circuit is further configured to determine an actual voltage step of the ultracapacitor based on two consecutive voltage measurements of the plurality of voltage measurements. The control circuit is even further configured to determine whether the actual voltage step exceeds a threshold voltage step of the ultracapacitor. Furthermore, in response to determining the actual voltage step exceeds the threshold voltage step, the control circuit is configured to provide a notification associated with performing a maintenance action on the ultracapacitor.

Other features and aspects of the present disclosure are set forth in greater detail below.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figure in which.

Figure 1:
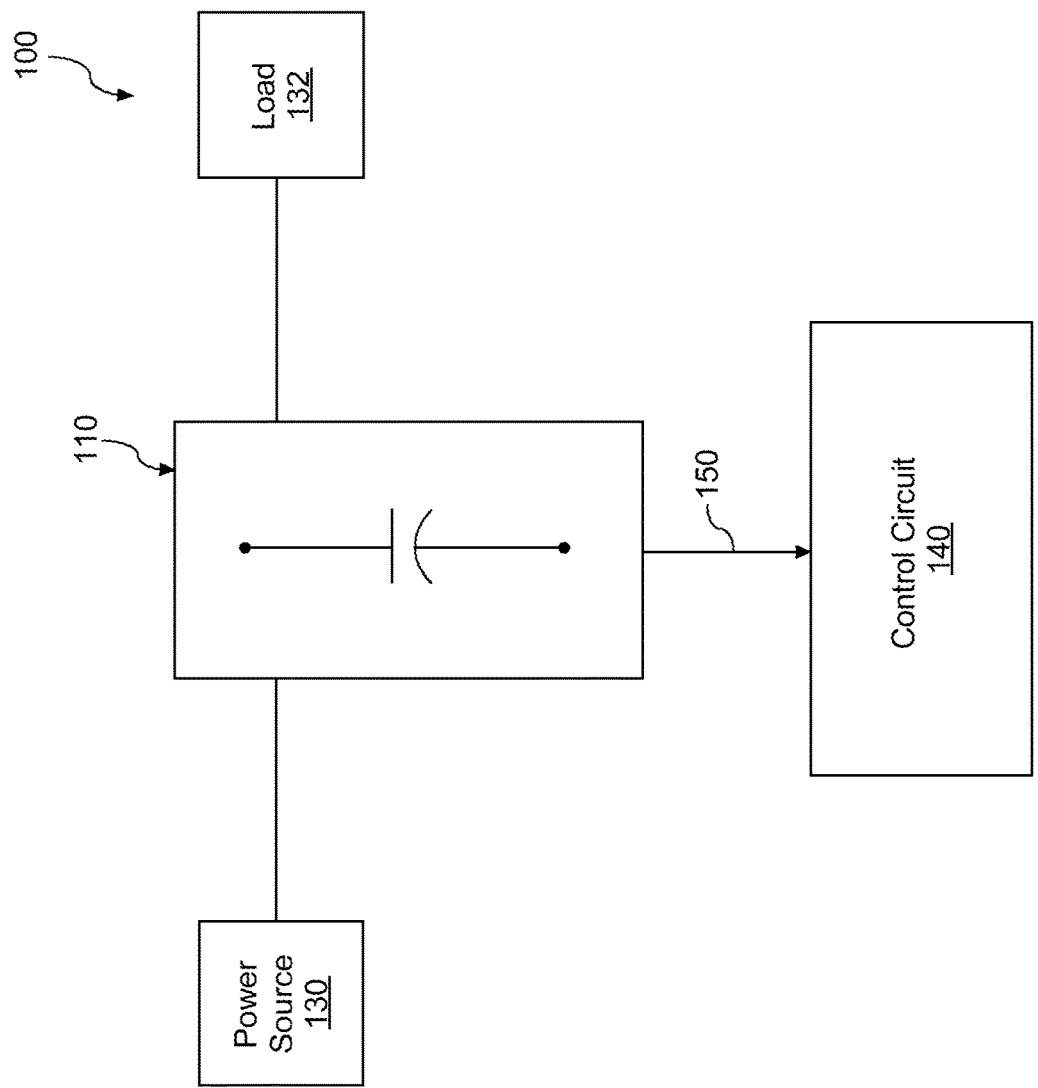
FIG. 1 depicts a system for monitoring one or more characteristics of an ultracapacitor according to example embodiments of the present disclosure.

Repeat use of reference characters in the present specification and drawing is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Example aspects of the present disclosure are directed to a system and related method of monitoring one or more characteristics (e.g., capacitance, equivalent series resistance (ESR), etc.) of an ultracapacitor. The system can include a control circuit configured to monitor a voltage step (e.g., change in a voltage across the ultracapacitor with respect to time) to determine the one or more characteristics of the ultracapacitor. For instance, the control circuit can be configured to obtain a plurality of voltage measurements indicative of a voltage across the ultracapacitor. Each of the plurality of voltage measurements can be obtained sequentially at one of a plurality of intervals. For example, in some implementations, the control circuit can be configured to obtain a voltage measurement every about 2 milliseconds. As used herein, the term "about" refers to a range of values within 10% of a stated numerical value.

The control circuit can be configured to determine an actual voltage step of the ultracapacitor for an interval of the plurality of intervals based on two consecutive voltage measurements. For instance, the control circuit can obtain a first voltage measurement and a second voltage measurement. The first voltage measurement can be indicative of the voltage across the ultracapacitor at a first instance of time. The second voltage measurement can be indicative of the voltage across the ultracapacitor at a second instance of time that occurs after the first instance of time by an amount of time corresponding to the interval. The control circuit can be configured to determine the actual voltage step of the ultracapacitor based, at least in part, on the first voltage measurement and the second voltage measurement. For instance, the control circuit can be configured to determine a difference between the first voltage measurement and the second voltage measurement to determine the actual voltage step of the ultracapacitor for an interval of time (e.g., amount of time lapsing between first voltage measurement and second voltage measurement).

The control circuit can be configured to determine a threshold voltage step of the ultracapacitor. For instance, in some implementations, the control circuit can be configured to determine the threshold voltage step based, at least in part, on the interval of time and a magnitude of a current provided to the ultracapacitor for the interval of time. Alternatively, or additionally, the threshold voltage step of the ultracapacitor can be determined based, at least in part, on a maximum voltage across the ultracapacitor with current. More specifically, the maximum voltage change with current can be determined based, at least in part, on a capacitance of the ultracapacitor and the equivalent series resistance (ESR) of the ultracapacitor. In some implementations, the threshold voltage step can be about 2 or 3 times the maximum voltage change of the ultracapacitor with current.

The control circuit can be further configured to determine whether the actual voltage step of the ultracapacitor exceeds the threshold voltage step of the ultracapacitor. For instance, the control circuit can be configured to compare a magnitude of the actual voltage step to a magnitude of the threshold voltage step to determine whether the actual voltage step exceeds the threshold voltage step.

In response to determining the actual voltage step of the ultracapacitor exceeds the threshold voltage step of the ultracapacitor, the control circuit can be configured to provide an electronic communication indicative of a need to perform a maintenance action on the ultracapacitor. For instance, in some implementations, the electronic communication can be a text message or an e-mail. Alternatively, or additionally, the electronic communication can be an audible alert or notification (e.g., automated phone call). In this manner, the notification can prompt a person (e.g., technician) to repair or replace the ultracapacitor.

In some implementations, the control circuit can be further configured to provide one or more control signals associated with controlling operation of one or more switching devices in response to determining the actual voltage step of the ultracapacitor exceeds the threshold voltage step of the ultracapacitor. More specifically, the one or more control signals can be associated with controlling operation of the one or more switching devices to decouple the ultracapacitor from a power source (e.g., DC power source). In this manner, the ultracapacitor can be decoupled from the power source when the person arrives to perform the maintenance action on the ultracapacitor. Additionally, in some implementations, the one or more control signals can be associated with decoupling the power source from an electrical load. In this manner, the ultracapacitor can be decoupled from electrical load when the person arrives to perform the maintenance action on the ultracapacitor.

The system and related method for monitoring one or more characteristics of an ultracapacitor can provide numerous technical effects and benefits. For instance, the control circuit can determine the one or more characteristics of the ultracapacitor based, at least in part, on the plurality of voltage measurements the control circuit is already receiving. In this manner, the one or more characteristics of the ultracapacitor can be determined without requiring any additional hardware. Furthermore, the control circuit can determine the one or more conditions of the ultracapacitor without requiring the ultracapacitor be taken offline (e.g., decoupled from a power source). In this manner, the one or more characteristics of the ultracapacitor can be determined even while the ultracapacitor is online (e.g., coupled to the power source).

Referring now to the FIGS., FIG. 1 depicts a system 100 for monitoring one or more characteristics of an ultracapacitor 110 according to example embodiments of the present disclosure. As shown, the ultracapacitor 110 can be coupled between a power source 130 (e.g., direct current) and a load 132. In this manner, the power source 130 can charge the ultracapacitor 110. Furthermore, the ultracapacitor 110 can provide (e.g., discharge) a current to the load 132.

As shown, the system 100 can include a control circuit 140. In some implementations, the control circuit 140 can include a processing circuit (not shown). As used herein, the term "processor" or "processing circuit" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits.

The control circuit 140 can be configured to obtain a plurality of signals 150 indicative of a voltage across the ultracapacitor 110. Furthermore, the control circuit 140 can be configured to determine one or more characteristics (e.g., capacitance, ESR (equivalent series resistance), etc.) of the ultracapacitor 110 based, at least in part, on the plurality of signals 150. For instance, the control circuit 140 can be configured to determine a capacitance of the ultracapacitor 110 is decreasing based, at least in part, on the magnitude of a change in the voltage across the ultracapacitor 110 over an interval of time lapsing between two consecutive voltage measurements. Alternatively, the control circuit 140 can be configured to determine the ESR of the ultracapacitor 110 is increasing based, at least in part, on the magnitude of a change in the voltage across the ultracapacitor 110 over the interval of time. In either instance, the control circuit 140 can be configured to provide an electronic communication to prompt a person (e.g., technician) to perform a maintenance action on the ultracapacitor 110.

Figure 2:
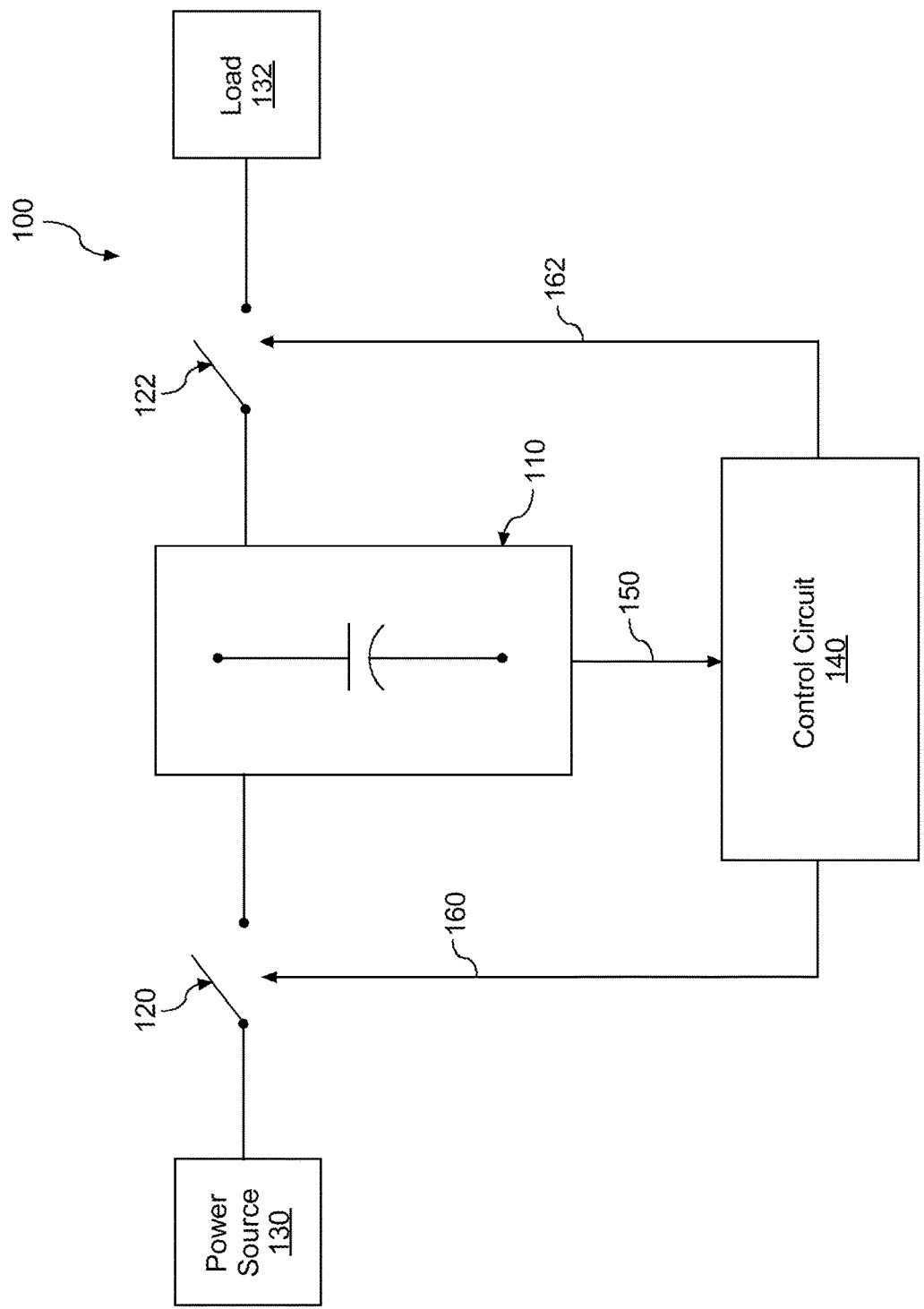
FIG. 2 depicts another system for monitoring one or more characteristics of an ultracapacitor according to example embodiments of the present disclosure.

Referring now to FIG. 2, another embodiment of the system 100 is provided according to example embodiments of the present disclosure. As shown, the system 100 can include a first switching device 120 coupled between the ultracapacitor 110 and the power source 130 (e.g., direct current (DC) power source). The first switching device 120 can be configurable in a first state (FIG. 1) in which the ultracapacitor 110 is decoupled from the power source 130 and a second state (not shown) in which the ultracapacitor 110 is coupled to the power source 130. When the ultracapacitor 110 is coupled to the power source 130 via the first switching device 120, the ultracapacitor 110 can draw electrical power from the power source 130. In this manner, the power source 130 can charge the ultracapacitor 110 when the first switching device 120 is in the first state.

The system 100 can further include a second switching device 122 coupled between the ultracapacitor 110 and the load 132. The second switching device 122 can be configurable in a first state (FIG. 1) in which the ultracapacitor 110 is decoupled from the load 132 and a second state (not shown) in which the ultracapacitor 110 is coupled to the load 132 via the second switching device 122. When the second switching device 122 is in the second state, the ultracapacitor 110 can provide a current to the load 132.

In some implementations, the first switching device 120 and the second switching device 122 can include a transistor (e.g., field effect transistor). It should be appreciated, however, that the first switching device 120 and the second switching device 122 can include any suitable device configured to selectively couple the ultracapacitor 110 to the power source 130. It should also be appreciated that the load 132 drawing power from the power source 130 can include a suitable load.

The control circuit 140 can be communicatively coupled to the first switching device 120 and the second switching device 122. In this manner, the control circuit 140 can provide one or more control signals 160, 162 to the first switching device 120 and the second switching device 122, respectively. More specifically, the one or more control signals 160, 162 can be associated with controlling operation of the first switching device 120 and the second switching device 122, respectively. For instance, the control circuit 140 can provide one or more control signals 160 associated with coupling the ultracapacitor 110 to the power source 130 via the first switching device 120 to control charging of the ultracapacitor. Alternatively, the control circuit can provide one or more control signals 160 associated with decoupling the ultracapacitor 110 from the power source 130 and/one or more control signals 162 associated with coupling the ultracapacitor 110 to the load 132 to control discharging of the ultracapacitor 110.

Figure 3:
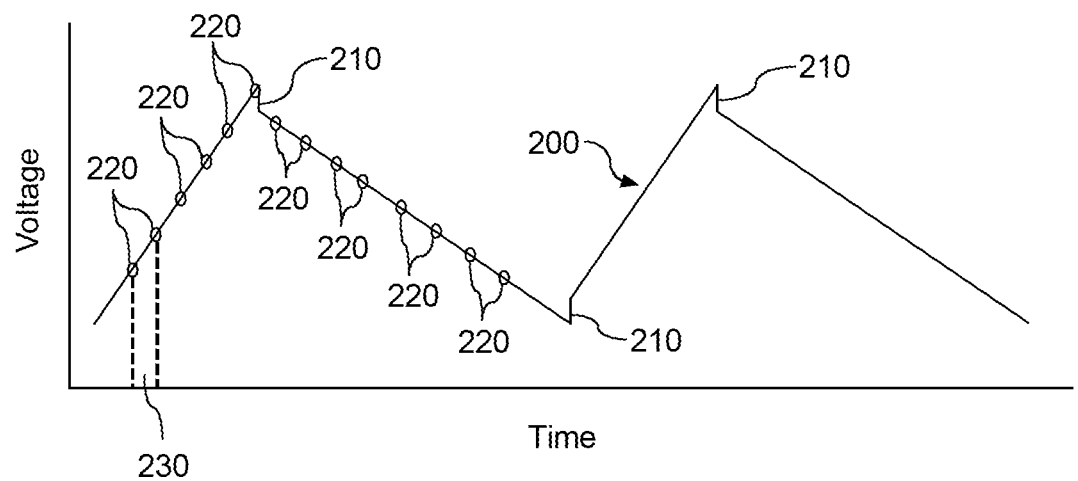
FIG. 3 depicts a graphical representation of a charge-discharge curve associated with an ultracapacitor according to example embodiments of the present disclosure.

FIG. 3 depicts a graphical representation of charge-discharge curve 200 of an ultracapacitor according to example embodiments of the present disclosure. More specifically, a change in voltage of the ultracapacitor with respect to time during two charge-discharge cycles is depicted. As shown, a measured voltage across the ultracapacitor increases with respect to time during the charge cycle. Conversely, the measured voltage across the ultracapacitor decreases with respect to time during the discharge cycle. Furthermore, a voltage step 210 due, at least in part, to an equivalent series resistance (ESR) of the ultracapacitor occurs each time the ultracapacitor switches between the charge cycle and the discharge cycle.

As shown, the charge-discharge curve 200 can include the plurality of voltage measurements 220 indicative of a voltage across the ultracapacitor 110 (FIGS. 1 and 2). The plurality of voltage measurements 220 can be obtained sequentially at one interval of a plurality of intervals 230. For instance, each of the plurality of voltage measurements can be obtained sequentially at an even interval of time (e.g., every 2 milliseconds).

It should be understood, however, that the plurality of voltage measurements can be obtained at any suitable interval of time. For instance, in some implementations, each of the plurality of voltage measurements can be obtained sequentially at an odd interval (e.g., every three milliseconds). It should also be understood that, in some implementations, a duration of each of the plurality of intervals of time can be same. For instance, each interval can be about 2 milliseconds. As will be discussed below in more detail, the control circuit 140 of the system 100 discussed above with reference to FIGS. 1 and 2 can obtain the plurality of voltage measurements 220 to determine whether a voltage step of the ultracapacitor 110 for an interval 230 exceeds a threshold voltage step of the ultracapacitor 110 for the interval 230 to determine one or more characteristics of the ultracapacitor 110.

Figure 4:
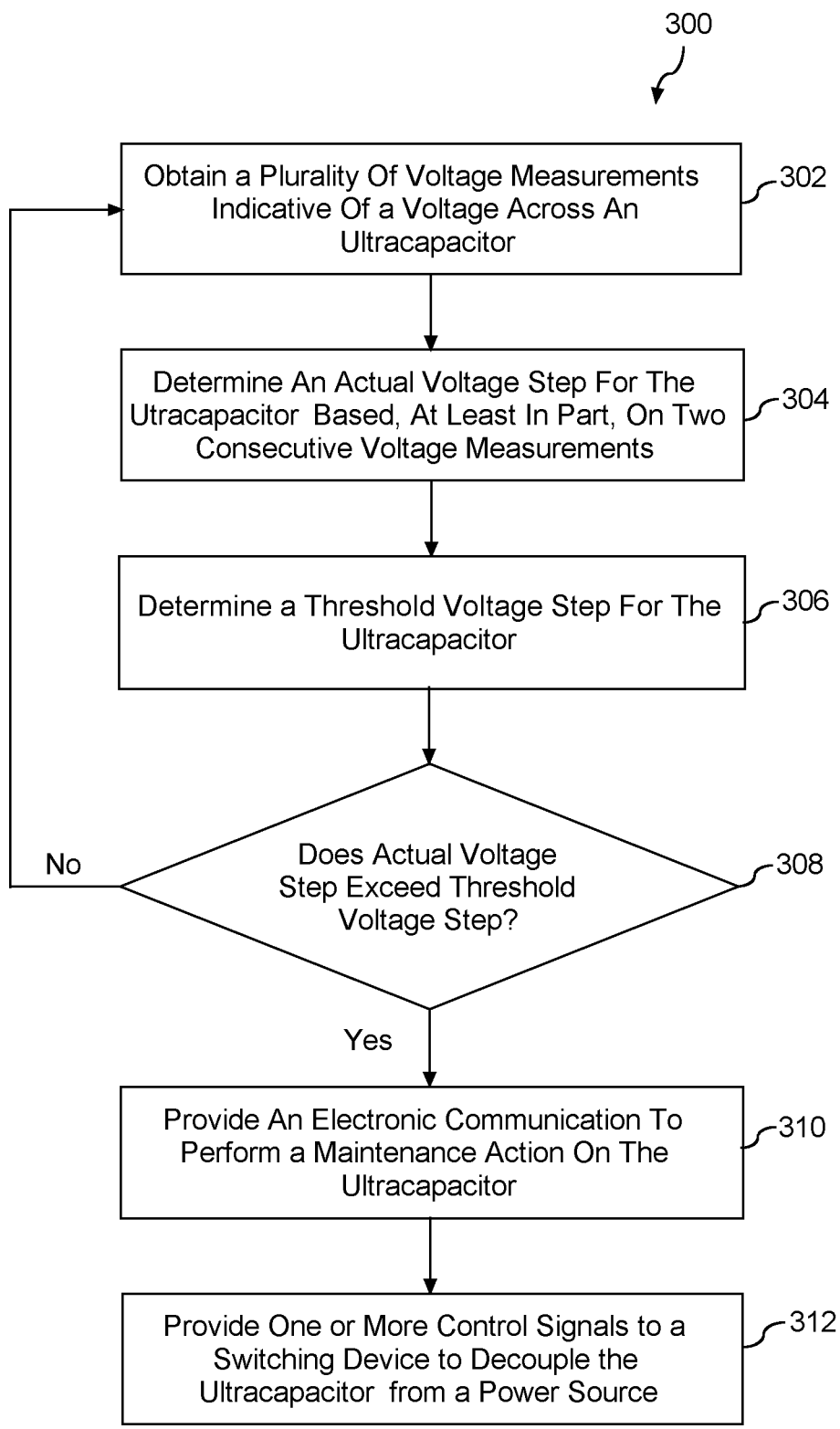
FIG. 4 depicts a flow diagram of an example method of monitoring one or more characteristics of an ultracapacitor according to example embodiments of the present disclosure.

FIG. 4 depicts a flow diagram of a method 300 according to example embodiments of the present disclosure. The method 300 can be implemented, for instance, using the system depicted in FIGS. 1 and 2. FIG. 4 depicts steps performed in a particular order for purposes of illustration and discussion. Those of ordinary skill in the art, using the disclosures provided herein, will understand that various steps of any of the methods disclosed herein can be omitted, rearranged, performed simultaneously, expanded, modified, and/or adapted in various ways without deviating from the scope of the present disclosure.

At (302), the method 300 can include obtaining, via a control circuit, a plurality of voltage measurements. In particular, each of the plurality of voltage measurements can be obtained sequentially at one of a plurality of intervals of time. Furthermore, each of the plurality of voltage measurements can be indicative of a voltage across the ultracapacitor at a given instant.

At (304), the method 300 can include determining, via the control circuit, an actual voltage step of the ultracapacitor based, at least in part, on two consecutive voltage measurements of the plurality of voltage measurements obtained at (302). For instance, in some implementations, the control circuit can be configured to determine the actual voltage step based, at least in part, on a first voltage measurement indicative of the voltage across the ultracapacitor at a first instance of time and a second voltage measurement indicative of the voltage across the ultracapacitor at a second instance. More specifically, the control circuit can be configured to determine a difference between the first voltage measurement and the second voltage measurement to determine the actual voltage step of the ultracapacitor for an interval of time (e.g., time lapse between first voltage measurement and second voltage measurement).

At (306), the method 300 can include determining, via the control circuit, a threshold voltage step of the ultracapacitor based, at least in part, on a capacitance of the ultracapacitor and a current provided to the ultracapacitor. In some implementations, the threshold voltage step can be determined by providing a current to the ultracapacitor. In such implementations, the threshold voltage step can be determined based, at least in part, on a capacitance of the ultracapacitor and a magnitude of the current being provided to the ultracapacitor. More specifically, a maximum voltage change of the ultracapacitor while receiving the current can be determined based, at leas tin part, on the capacitance of the ultracapacitor and the ESR of the ultracapacitor. In some implementations, the threshold voltage step can be about 2 or 3 times greater than the maximum voltage change of the ultracapacitor while receiving the current.

At (308), the method 300 can include determining whether the actual voltage step of the ultracapacitor as determined at (304) exceeds the threshold voltage step of the ultracapacitor as determined at (306). For instance, the control circuit can be configured to compare a magnitude the actual voltage step of the ultracapacitor to a magnitude of the threshold voltage step for the ultracapacitor. If the magnitude actual voltage step of the ultracapacitor exceeds the magnitude of the threshold voltage step of the ultracapacitor, the control circuit can determine a capacitance of the ultracapacitor is decreasing or the ESR of the ultracapacitor is increasing. Furthermore, the method proceeds to (310) if the actual voltage step of the ultracapacitor exceeds the threshold voltage step of the ultracapacitor. Otherwise, the method 300 reverts to (302).

At (310), the method 300 can include providing, via the one or more processors, an electronic communication associated with performing a maintenance action on the ultracapacitor in response to determining, at (308), that the actual voltage step of the ultracapacitor exceeds the threshold voltage step of the ultracapacitor. In some implementations, the electronic communication can include a visual notification (e.g., SMS message, e-mail, etc.). Alternatively, or additionally, the electronic communication can include an audible notification (e.g., audible alert, automated phone call, etc.). In this manner, the electronic communication can prompt a person (e.g., operator) to perform a maintenance action on the ultracapacitor. For instance, the electronic communication can prompt the person to repair the ultracapacitor. Alternatively, the electronic communication can prompt the person to change out (that is, replace) the ultracapacitor with another ultracapacitor.

At (312), the method 300 can include providing one or more control signals associated with controlling operation of one or more switching devices to decouple the ultracapacitor from a power source. In this manner, the ultracapacitor can be decoupled from the power source when the person arrives to perform the maintenance action on the ultracapacitor. Additionally, in some implementations, the one or more control signals can be associated with controlling operation of one or more switching devices to decouple the ultracapacitor from an electrical load. In this manner, the ultracapacitor can be decoupled from the electrical load when the person arrives to perform the maintenance action on the ultracapacitor.

Any of a variety of different individual ultracapacitors may generally be employed in the module according to example aspects of the present disclosure. In some embodiments, however, the ultracapacitor contains an electrode assembly and electrolyte contained and optionally hermetically sealed within a housing. The electrode assembly may, for instance, contain a first electrode that contains a first carbonaceous coating (e.g., activated carbon particles) electrically coupled to a first current collector, and a second electrode that contains a second carbonaceous coating (e.g., activated carbon particles) electrically coupled to a second current collector. It should be understood that additional current collectors may also be employed if desired, particularly if the ultracapacitor includes multiple energy storage cells. The current collectors may be formed from the same or different materials. Regardless, each collector is typically formed from a substrate that includes a conductive metal, such as aluminum, stainless steel, nickel, silver, palladium, etc., as well as alloys thereof. Aluminum and aluminum alloys are particularly suitable for use in the present disclosure. The substrate may be in the form of a foil, sheet, plate, mesh, etc. The substrate may also have a relatively small thickness, such as about 200 micrometers or less, in some embodiments from about 1 to about 100 micrometers, in some embodiments from about 5 to about 80 micrometers, and in some embodiments, from about 10 to about 50 micrometers. Although by no means required, the surface of the substrate may be optionally roughened, such as by washing, etching, blasting, etc.

In some embodiments, at least one of the first and second current collectors, and preferably both, may also contain a plurality of fiber-like whiskers that project outwardly from the substrate. Without intending to be limited by theory, it is believed that these whiskers can effectively increase the surface area of the current collector and also improve the adhesion of the current collector to the corresponding electrode. This can allow for the use of a relatively low binder content in the first electrode and/or second electrode, which can improve charge transfer and reduce interfacial resistance and consequently result in very low ESR values. The whiskers are typically formed from a material that contains carbon and/or a reaction product of carbon and the conductive metal. In one embodiment, for example, the material may contain a carbide of the conductive metal, such as aluminum carbide ($Al_4C_3$), In general, the plurality of whiskers project outwardly from a substrate. If desired, the whiskers may optionally project from a seed portion that is embedded within the substrate. Similar to the whiskers, the seed portion may also be formed from a material that contains carbon and/or a reaction product of carbon and the conductive metal, such as a carbide of the conductive metal (e.g., aluminum carbide).

The manner in which such whiskers are formed on the substrate may vary as desired. In one embodiment, for instance, the conductive metal of the substrate is reacted with a hydrocarbon compound. Examples of such hydrocarbon compounds may include, for instance, paraffin hydrocarbon compounds, such as methane, ethane, propane, n-butane, isobutane, pentane, etc.; olefin hydrocarbon compounds, such as ethylene, propylene, butene, butadiene, etc.; acetylene hydrocarbon compounds, such as acetylene; as well as derivatives or combinations of any of the foregoing. It is generally desired that the hydrocarbon compounds are in a gaseous form during the reaction. Thus, it may be desired to employ hydrocarbon compounds, such as methane, ethane, and propane, which are in a gaseous form when heated. Although not necessarily required, the hydrocarbon compounds are typically employed in a range of from about 0.1 parts to about 50 parts by weight, and in some embodiments, from about 0.5 parts by weight to about 30 parts by weight, based on 100 parts by weight of the substrate. To initiate the reaction with the hydrocarbon and conductive metal, the substrate is generally heated in an atmosphere that is at a temperature of about 300° C. or more, in some embodiments about 400° C. or more, and in some embodiments, from about 500° C. to about 650° C. The time of heating depends on the exact temperature selected, but typically ranges from about 1 hour to about 100 hours. The atmosphere typically contains a relatively low amount of oxygen to minimize the formation of a dielectric film on the surface of the substrate. For example, the oxygen content of the atmosphere may be about 1% by volume or less.

First and second carbonaceous coatings are also electrically coupled to the first and second current collectors, respectively. While they may be formed from the same or different types of materials and may contain one or multiple layers, each of the carbonaceous coatings generally contains at least one layer that includes activated particles. In certain embodiments, for instance, the activated carbon layer may be directly positioned over the current collector and may optionally be the only layer of the carbonaceous coating. Examples of suitable activated carbon particles may include, for instance, coconut shell-based activated carbon, petroleum coke-based activated carbon, pitch-based activated carbon, polyvinylidene chloride-based activated carbon, phenolic resin-based activated carbon, polyacrylonitrile-based activated carbon, and activated carbon from natural sources such as coal, charcoal or other natural organic sources.

In certain embodiments, it may be desired to selectively control certain aspects of the activated carbon particles, such as their particle size distribution, surface area, and pore size distribution to help improve ion mobility for certain types of electrolytes after being subjected to one or more charge-discharge cycles. For example, at least 50% by volume of the particles (D50 size) may have a size in the range of from about 0.01 to about 30 micrometers, in some embodiments from about 0.1 to about 20 micrometers, and in some embodiments, from about 0.5 to about 10 micrometers. At least 90% by volume of the particles (D90 size) may likewise have a size in the range of from about 2 to about 40 micrometers, in some embodiments from about 5 to about 30 micrometers, and in some embodiments, from about 6 to about 15 micrometers. The BET surface may also range from about 900 m²/g to about 3,000 m²/g, in some embodiments from about 1,000 m²/g to about 2,500 m²/g, and in some embodiments, from about 1,100 m²/g to about 1,800 m²/g.

In addition to having a certain size and surface area, the activated carbon particles may also contain pores having a certain size distribution. For example, the amount of pores less than about 2 nanometers in size (i.e., "micropores") may provide a pore volume of about 50 vol. % or less, in some embodiments about 30 vol. % or less, and in some embodiments, from 0.1 vol. % to 15 vol. % of the total pore volume. The amount of pores between about 2 nanometers and about 50 nanometers in size (i.e., "mesopores") may likewise be from about 20 vol. % to about 80 vol. %, in some embodiments from about 25 vol. % to about 75 vol. %, and in some embodiments, from about 35 vol. % to about 65 vol. %. Finally, the amount of pores greater than about 50 nanometers in size (i.e., "macropores") may be from about 1 vol. % to about 50 vol. %, in some embodiments from about 5 vol. % to about 40 vol. %, and in some embodiments, from about 10 vol. % to about 35 vol. %. The total pore volume of the carbon particles may be in the range of from about 0.2 cm³/g to about 1.5 cm³/g, and in some embodiments, from about 0.4 cm³/g to about 1.0 cm³/g, and the median pore width may be about 8 nanometers or less, in some embodiments from about 1 to about 5 nanometers, and in some embodiments, from about 2 to about 4 nanometers. The pore sizes and total pore volume may be measured using nitrogen adsorption and analyzed by the Barrett-Joyner-Halenda ("BJH") technique.

If desired, binders may be present in an amount of about 60 parts or less, in some embodiments 40 parts or less, and in some embodiments, from about 1 to about 25 parts per 100 parts of carbon in the first and/or second carbonaceous coatings. Binders may, for example, constitute about 15 wt. % or less, in some embodiments about 10 wt. % or less, and in some embodiments, from about 0.5 wt. % to about 5 wt. % of the total weight of a carbonaceous coating. Any of a variety of suitable binders can be used in the electrodes. For instance, water-insoluble organic binders may be employed in certain embodiments, such as styrene-butadiene copolymers, polyvinyl acetate homopolymers, vinyl-acetate ethylene copolymers, vinyl-acetate acrylic copolymers, ethylene-vinyl chloride copolymers, ethylene-vinyl chloride-vinyl acetate terpolymers, acrylic polyvinyl chloride polymers, acrylic polymers, nitrile polymers, fluoropolymers such as polytetrafluoroethylene or polyvinylidene fluoride, polyolefins, etc., as well as mixtures thereof. Water-soluble organic binders may also be employed, such as polysaccharides and derivatives thereof. In one particular embodiment, the polysaccharide may be a nonionic cellulosic ether, such as alkyl cellulose ethers (e.g., methyl cellulose and ethyl cellulose); hydroxyalkyl cellulose ethers (e.g., hydroxyethyl cellulose, hydroxypropyl cellulose, hydroxypropyl hydroxybutyl cellulose, hydroxyethyl hydroxypropyl cellulose, hydroxyethyl hydroxybutyl cellulose, hydroxyethyl hydroxypropyl hydroxybutyl cellulose, etc.); alkyl hydroxyalkyl cellulose ethers (e.g., methyl hydroxyethyl cellulose, methyl hydroxypropyl cellulose, ethyl hydroxyethyl cellulose, ethyl hydroxypropyl cellulose, methyl ethyl hydroxyethyl cellulose and methyl ethyl hydroxypropyl cellulose); carboxyalkyl cellulose ethers (e.g., carboxymethyl cellulose); and so forth, as well as protonated salts of any of the foregoing, such as sodium carboxymethyl cellulose.

Other materials may also be employed within an activated carbon layer of the first and/or second carbonaceous coatings and/or within other layers of the first and/or second carbonaceous coatings. For example, in certain embodiments, a conductivity promoter may be employed to further increase electrical conductivity. Exemplary conductivity promoters may include, for instance, carbon black, graphite (natural or artificial), graphite, carbon nanotubes, nanowires or nanotubes, metal fibers, graphenes, etc., as well as mixtures thereof. Carbon black is particularly suitable. When employed, conductivity promoters typically constitute about 60 parts or less, in some embodiments 40 parts or less, and in some embodiments, from about 1 to about 25 parts per 100 parts of the activated carbon particles in a carbonaceous coating. Conductivity promotes may, for example, constitute about 15 wt. % or less, in some embodiments about 10 wt. % or less, and in some embodiments, from about 0.5 wt. % to about 5 wt. % of the total weight of a carbonaceous coating. Activated carbon particles likewise typically constitute 85 wt. % or more, in some embodiments about 90 wt. % or more, and in some embodiments, from about 95 wt. % to about 99.5 wt. % of a carbonaceous coating.

The particular manner in which a carbonaceous coating is applied to a current collector may vary, such as printing (e.g., rotogravure), spraying, slot-die coating, drop-coating, dip-coating, etc. Regardless of the manner in which it is applied, the resulting electrode is typically dried to remove moisture from the coating, such as at a temperature of about 100° C. or more, in some embodiments about 200° C. or more, and in some embodiments, from about 300° C. to about 500° C. The electrode may also be compressed (e.g., calendered) to optimize the volumetric efficiency of the ultracapacitor. After any optional compression, the thickness of each carbonaceous coating may generally vary based on the desired electrical performance and operating range of the ultracapacitor. Typically, however, the thickness of a coating is from about 20 to about 200 micrometers, 30 to about 150 micrometers, and in some embodiments, from about 40 to about 100 micrometers. Coatings may be present on one or both sides of a current collector. Regardless, the thickness of the overall electrode (including the current collector and the carbonaceous coating(s) after optional compression) is typically within a range of from about 20 to about 350 micrometers, in some embodiments from about 30 to about 300 micrometers, and in some embodiments, from about 50 to about 250 micrometers.

The electrode assembly also typically contains a separator that is positioned between the first and second electrodes. If desired, other separators may also be employed in the electrode assembly. For example, one or more separators may be positioned over the first electrode, the second electrode, or both. The separators enable electrical isolation of one electrode from another to help prevent an electrical short, but still allow transport of ions between the two electrodes. In certain embodiments, for example, a separator may be employed that includes a cellulosic fibrous material (e.g., airlaid paper web, wet-laid paper web, etc.), nonwoven fibrous material (e.g., polyolefin nonwoven webs), woven fabrics, film (e.g., polyolefin film), etc. Cellulosic fibrous materials are particularly suitable for use in the ultracapacitor, such as those containing natural fibers, synthetic fibers, etc. Specific examples of suitable cellulosic fibers for use in the separator may include, for instance, hardwood pulp fibers, softwood pulp fibers, rayon fibers, regenerated cellulosic fibers, etc. Regardless of the particular materials employed, the separator typically has a thickness of from about 5 to about 150 micrometers, in some embodiments from about 10 to about 100 micrometers, and in some embodiments, from about 20 to about 80 micrometers.

The manner in which the components of the electrode assembly are combined together may vary. For example, the electrodes and separator may be initially folded, wound, stacked, or otherwise contacted together to form an electrode assembly. In one particular embodiment, the electrodes, separator, and optional electrolyte may be wound into an electrode assembly having a "jelly-roll" configuration.

To form an ultracapacitor, an electrolyte is placed into ionic contact with the first electrode and the second electrode before, during, and/or after the electrodes and separator are combined together to form the electrode assembly. The electrolyte is generally nonaqueous in nature and thus contains at least one nonaqueous solvent. To help extend the operating temperature range of the ultracapacitor, it is typically desired that the nonaqueous solvent have a relatively high boiling temperature, such as about 150° C. or more, in some embodiments about 200° C. or more, and in some embodiments, from about 220° C. to about 300° C. Particularly suitable high boiling point solvents may include, for instance, cyclic carbonate solvents, such as ethylene carbonate, propylene carbonate, butylene carbonate, vinylene carbonate, etc. Of course, other nonaqueous solvents may also be employed, either alone or in combination with a cyclic carbonate solvent. Examples of such solvents may include, for instance, open-chain carbonates (e.g., dimethyl carbonate, ethyl methyl carbonate, diethyl carbonate, etc.), aliphatic monocarboxylates (e.g., methyl acetate, methyl propionate, etc.), lactone solvents (e.g., butyrolactone valerolactone, etc.), nitriles (e.g., acetonitrile, glutaronitrile, adiponitrile, methoxyacetonitrile, 3-methoxypropionitrile, etc.), amides (e.g., N,N-dimethylformamide, N,N-diethylacetamide, N-methylpyrrolidinone), alkanes (e.g., nitromethane, nitroethane, etc.), sulfur compounds (e.g., sulfolane, dimethyl sulfoxide, etc.); and so forth.

The electrolyte may also contain at least one ionic liquid, which is dissolved in the nonaqueous solvent. While the concentration of the ionic liquid can vary, it is typically desired that the ionic liquid is present at a relatively high concentration. For example, the ionic liquid may be present in an amount of about 0.8 moles per liter (M) of the electrolyte or more, in some embodiments about 1.0 M or more, in some embodiments about 1.2 M or more, and in some embodiments, from about 1.3 to about 1.8 M.

The ionic liquid is generally a salt having a relatively low melting temperature, such as about 400° C. or less, in some embodiments about 350° C. or less, in some embodiments from about 1° C. to about 100° C., and in some embodiments, from about 5° C. to about 50° C. The salt contains a cationic species and counterion. The cationic species contains a compound having at least one heteroatom (e.g., nitrogen or phosphorous) as a "cationic center." Examples of such heteroatomic compounds include, for instance, unsubstituted or substituted organoquaternary ammonium compounds, such as ammonium (e.g., trimethylammonium, tetraethylammonium, etc.), pyridinium, pyridazinium, pyramidinium, pyrazinium, imidazolium, pyrazolium, oxazolium, triazolium, thiazolium, quinolinium, piperidinium, pyrrolidinium, quaternary ammonium spiro compounds in which two or more rings are connected together by a spiro atom (e.g., carbon, heteroatom, etc.), quaternary ammonium fused ring structures (e.g., quinolinium, isoquinolinium, etc.), and so forth. In one particular embodiment, for example, the cationic species may be an N-spirobicyclic compound, such as symmetrical or asymmetrical N-spiro-bicyclic compounds having cyclic rings. One example of such a compound has the following structure:

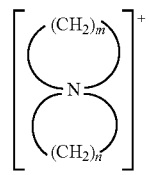

wherein m and n are independently a number from 3 to 7, and in some embodiments, from 4 to 5 (e.g., pyrrolidinium or piperidinium).

Suitable counterions for the cationic species may likewise include halogens (e.g., chloride, bromide, iodide, etc.); sulfates or sulfonates (e.g., methyl sulfate, ethyl sulfate, butyl sulfate, hexyl sulfate, octyl sulfate, hydrogen sulfate, methane sulfonate, dodecylbenzene sulfonate, dodecylsulfate, trifluoromethane sulfonate, heptadecafluorooctanesulfonate, sodium dodecylethoxysulfate, etc.); sulfosuccinates; amides (e.g., dicyanamide); imides (e.g., bis(pentafluoroethyl-sulfonyl)imide, bis(trifluoromethylsulfonyl)imide, bis(trifluoromethyl)imide, etc.); borates (e.g., tetrafluoroborate, tetracyanoborate, bis[oxalato]borate, bis[salicylato]borate, etc.); phosphates or phosphinates (e.g., hexafluorophosphate, diethylphosphate, bis(pentafluoroethyl)phosphinate, tris(pentafluoroethyl)-trifluorophosphate, tris(nonafluorobutyl)trifluorophosphate, etc.); antimonates (e.g., hexafluoroantimonate); aluminates (e.g., tetrachloroaluminate); fatty acid carboxylates (e.g., oleate, isostearate, pentadecafluorooctanoate, etc.); cyanates; acetates; and so forth, as well as combinations of any of the foregoing.

Several examples of suitable ionic liquids may include, for instance, spiro-(1,1')-bipyrrolidinium tetrafluoroborate, triethylmethyl ammonium tetrafluoroborate, tetraethyl ammonium tetrafluoroborate, spiro-(1,1')-bipyrrolidinium iodide, triethylmethyl ammonium iodide, tetraethyl ammonium iodide, methyltriethylammonium tetrafluoroborate, tetrabutylammonium tetrafluoroborate, tetraethylammonium hexafluorophosphate, etc.

As noted above, the ultracapacitor also contains a housing within which the electrode assembly and electrolyte are retained and optionally hermetically sealed. The nature of the housing may vary as desired. In one embodiment, for example, the housing may contain a metal container ("can"), such as those formed from tantalum, niobium, aluminum, nickel, hafnium, titanium, copper, silver, steel (e.g., stainless), alloys thereof, composites thereof (e.g., metal coated with electrically conductive oxide), and so forth. Aluminum is particularly suitable for use in the present disclosure. The metal container may have any of a variety of different shapes, such as cylindrical, D-shaped, etc. Cylindrically-shaped containers are particular suitable.

In another embodiment, for example, the housing may be in the form of a flexible package that encloses the components of the ultracapacitor. The package generally includes a substrate that extends between two ends and has edges wherein the ends, as well as the portions of both sides that overlap, are fixedly and sealingly abutted against one another (e.g., by heat welding). In this manner, the electrolyte can be retained within the package. The substrate typically has a thickness within the range of from about 20 micrometers to about 1,000 micrometers; in some embodiments from about 50 micrometers to about 800 micrometers, and in some embodiments, from about 100 micrometers to about 600 micrometers.

The substrate may contain any number of layers desired to achieve the desired level of barrier properties, such as 1 or more, in some embodiments 2 or more, and in some embodiments, from 2 to 4 layers. Typically, the substrate contains a barrier layer, which may include a metal, such as aluminum, nickel, tantalum, titanium, stainless steel, etc. Such a barrier layer is generally impervious to the electrolyte so that it can inhibit leakage thereof, and also generally impervious to water and other contaminants. If desired, the substrate may also contain an outer layer that serves as a protective layer for the package. In this manner, the barrier layer is positioned between the outer layer and the electrode assembly. The outer layer may, for instance, be formed from a polymer film, such as those formed from a polyolefin (e.g., ethylene copolymers, propylene copolymers, propylene homopolymers, etc.), polyesters, etc. Particularly suitable polyester films may include, for example, polyethylene terephthalate, polyethylene naphthalate, polybutylene terephthalate, etc.

If desired, the substrate may also contain an inner layer that is positioned between the electrode assembly and the barrier layer. In certain embodiments, the inner layer may contain a heat-sealable polymer. Suitable heat-sealable polymers may include, for instance, vinyl chloride polymers, vinyl chloridine polymers, ionomers, etc., as well as combinations thereof. Ionomers are particularly suitable. In one embodiment, for instance, the ionomer may be a copolymer that contains an α-olefin and (meth)acrylic acid repeating unit. Specific α-olefins may include ethylene, propylene, 1-butene, 3-methyl-1-butene; 3,3-dimethyl-1-butene; 1-pentene; 1-pentene with one or more methyl, ethyl or propyl substituents; 1-hexene with one or more methyl, ethyl or propyl substituents; 1-heptene with one or more methyl, ethyl or propyl substituents; 1-octene with one or more methyl, ethyl or propyl substituents; 1-nonene with one or more methyl, ethyl or propyl substituents; ethyl, methyl or dimethyl-substituted 1-decene; 1-dodecene; and styrene. Ethylene is particularly suitable. As noted, the copolymer may also a (meth)acrylic acid repeating unit. As used herein, the term "(meth)acrylic" includes acrylic and methacrylic monomers, as well as salts or esters thereof, such as acrylate and methacrylate monomers. Examples of such (meth) acrylic monomers may include methyl acrylate, ethyl acrylate, n-propyl acrylate, i-propyl acrylate, n-butyl acrylate, s-butyl acrylate, i-butyl acrylate, t-butyl acrylate, n-amyl acrylate, i-amyl acrylate, isobornyl acrylate, n-hexyl acrylate, 2-ethylbutyl acrylate, 2-ethylhexyl acrylate, n-octyl acrylate, n-decyl acrylate, methylcyclohexyl acrylate, cyclopentyl acrylate, cyclohexyl acrylate, methyl methacrylate, ethyl methacrylate, 2-hydroxyethyl methacrylate, n-propyl methacrylate, n-butyl methacrylate, i-propyl methacrylate, methacrylate, n-amyl methacrylate, n-hexyl methacrylate, amyl methacrylate, s-butyl-methacrylate, t-butyl methacrylate, 2-ethylbutyl methacrylate, methylcyclohexyl methacrylate, cinnamyl methacrylate, crotyl methacrylate, cyclohexyl methacrylate, cyclopentyl methacrylate, 2-ethoxyethyl methacrylate, isobornyl methacrylate, etc., as well as combinations thereof. Typically, the α-olefin/(meth) acrylic acid copolymer is at least partially neutralized with a metal ion to form the ionomer. Suitable metal ions may include, for instance, alkali metals (e.g., lithium, sodium, potassium, etc.), alkaline earth metals (e.g., calcium, magnesium, etc.), transition metals (e.g., manganese, zinc, etc.), and so forth, as well as combinations thereof. The metal ions may be provided by an ionic compound, such as a metal formate, acetate, nitrate, carbonate, hydrogen carbonate, oxide, hydroxide, alkoxide, and so forth.

Within the module, the manner in which the ultracapacitors are connected may vary. For example, the ultracapacitors may be connected using an interconnect that attaches to or connects the respective terminals of the ultracapacitors. The interconnect may be made of a conductive material, such as a conductive metal. In one embodiment, the interconnect may be relatively flat or may be one having an increased surface area. Regarding the latter, the interconnect may have projections/protrusions or may also be formed from wires, braids, coils, etc. In this regard, the specific dimensions and configuration of the interconnects is not necessarily limited. Regardless of its form, any of a variety of different conductive materials may be employed, such as copper, tin, nickel, aluminum, etc., as well as alloys and/or coated metals. If desired, the conductive material may optionally be insulated with a sheath material.

The ultracapacitors may be electrically connected together in series or in parallel, depending on the particular properties desired. For instance, in one particular embodiment, the ultracapacitors may be electrically connected in series such that a terminal of a certain polarity (e.g., positive) of one ultracapacitor is connected to a terminal of opposite polarity (e.g., negative) of another ultracapacitor. For instance, the positive terminal may extend from a top portion of the first ultracapacitor and the negative terminal may extend from a bottom portion of the second ultracapacitor.

Ultracapacitors and modules containing them can be employed to store large amounts of electrical charge. As a result, the modules and ultracapacitors of the present disclosure can be employed in a variety of applications. For instance, they can be used in a variety of energy applications including, but not limited to, wind turbines, solar turbines, solar panels, and fuel cells. In addition, they can also be used in a variety of transportation applications including, but not limited to, vehicles (e.g., battery propelled electric vehicles, hybrid electric vehicles including buses, engine starts, power and braking recuperation systems, etc.), trains and trams (e.g., maglev trains, track switching, starter systems, etc.), and aerospace (e.g., actuators for doors, evacuation slides, etc.). They also have a variety of industrial applications including automation (e.g., robotics, etc.), vehicles (e.g., fork lifts, cranes, electric carts, etc.). They also have a variety of applications in consumer electronics (e.g., portable media players, hand-held devices, GPS, digital cameras, etc.), computers (e.g., laptop computers, PDAs, etc.), and communications systems. The modules and ultracapacitors may also have a variety of military applications (e.g., motor startups for tanks and submarines, phased array radar antennae, laser power supplies, radio communications, avionics display and instrumentation, GPS guidance, etc.) and medical applications (e.g., defibrillators, etc.).

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method for monitoring one or more characteristics of an ultracapacitor, the method comprising:
   obtaining, via a control circuit, a plurality of voltage measurements, each of the plurality of voltage measurements obtained sequentially at one of a plurality of intervals, each of the plurality of voltage measurements indicative of a voltage across the ultracapacitor;
   determining, via the control circuit, an actual voltage step of the ultracapacitor that occurs when the ultracapacitor switches between a charge cycle and a discharge cycle and is based on two consecutive voltage measurements of the plurality of voltage measurements;
   determining, via the control circuit, whether the actual voltage step exceeds a threshold voltage step of the ultracapacitor when switching between the charging cycle and the discharge cycle; and
   responsive to determining the actual voltage step exceeds the threshold voltage step, providing, via the control circuit, a notification associated with performing a maintenance action on the ultracapacitor.

2. The method of claim 1, further comprising:
   determining, via the control circuit, the threshold voltage step of the ultracapacitor based, at least in part, on a capacitance of the ultracapacitor and a magnitude of a current provided to the ultracapacitor.

3. The method of claim 2, wherein determining the threshold voltage step of the ultracapacitor comprises determining, via the control circuit, a maximum voltage change across the ultracapacitor with the current.

4. The method of claim 3, wherein the threshold voltage step is about 2 times greater than the maximum voltage change across the ultracapacitor.

5. The method of claim 1, wherein a duration of each of the plurality of intervals is the same.

6. The method of claim 1, wherein when the actual voltage step of the ultracapacitor exceeds the threshold voltage step of the ultracapacitor, a capacitance of the ultracapacitor is decreasing.

7. The method of claim 1, wherein when the actual voltage step of the ultracapacitor exceeds the threshold voltage step of the ultracapacitor, an equivalent series resistance (ESR) of the ultracapacitor is increasing.

8. The method of claim 1, wherein determining whether the actual voltage step exceeds the threshold voltage step comprises determining, via the control circuit, whether a magnitude of the actual voltage step exceeds a magnitude of the threshold voltage step.

9. The method of claim 1, wherein the notification comprises an electronic communication.

10. The method of claim 1, wherein the maintenance action comprises replacing the ultracapacitor.

11. The method of claim 1, further comprising:
    responsive to determining the actual voltage step of the ultracapacitor exceeds the threshold voltage step of the ultracapacitor, providing, via the control circuit, one or more control signals associated with controlling operation of one or more switching devices to decouple the ultracapacitor from a power source.

12. The method of claim 11, further comprising:
    responsive to determining the actual voltage step of the ultracapacitor exceeds the threshold voltage step of the ultracapacitor, providing, via the control circuit, one or more control signals associated with controlling operation of one or more switching devices to decouple the ultracapacitor from an electrical load.

13. A system for monitoring one or more characteristics of an ultracapacitor, the system comprising:
    one or more switching devices configured to selectively couple the ultracapacitor to a power source or a load; and
    a control circuit communicatively coupled to the one or more switching devices, the control circuit configured to:
    obtain a plurality of voltage measurements, each of the plurality of voltage measurements obtained sequentially at one of a plurality of intervals, each of the plurality of voltage measurements indicative of a voltage across the ultracapacitor;
    determine an actual voltage step of the ultracapacitor that occurs when the ultracapacitor switches between a charge cycle and a discharge cycle and is based on two consecutive voltage measurements of the plurality of voltage measurements;
    determine whether the actual voltage step exceeds a threshold voltage step of the ultracapacitor when switching between the charge cycle and the discharge cycle; and
    in response to determining the actual voltage step exceeds the threshold voltage step, provide a notification associated with performing a maintenance action on the ultracapacitor.

14. The system of claim 13, wherein the control circuit is further configured to:
    determine the threshold voltage step based, at least in part, on a capacitance of the ultracapacitor and a current provided to the ultracapacitor.

15. The system of claim 13, wherein a duration of each of the plurality of intervals is the same.

16. The system of claim 13, wherein when the actual voltage step of the ultracapacitor exceeds the threshold voltage step of the ultracapacitor, a capacitance of the ultracapacitor is decreasing.

17. The system of claim 13, wherein when the actual voltage step of the ultracapacitor exceeds the threshold voltage step of the ultracapacitor, an equivalent series resistance (ESR) of the ultracapacitor is increasing.

18. The system of claim 13, wherein response to determining the actual voltage step exceeds the threshold voltage step, the control circuit is further configured to:
    provide one or more control signals associated with controlling operation of the one or more switching devices to decouple the ultracapacitor from the power source and an electrical load.

19. The system of claim 13, wherein the notification comprises an electronic communication.

20. The system of claim 13, wherein the maintenance action comprises replacing the ultracapacitor.

* * * * *